United States Patent [19]
Spigarelli

[11] Patent Number: 5,234,151
[45] Date of Patent: Aug. 10, 1993

[54] SENSING OF SOLDER MELTING AND SOLIDIFICATION

[76] Inventor: Donald J. Spigarelli, 99 Indian Hill Rd., Groton, Mass. 01450

[21] Appl. No.: 936,950

[22] Filed: Aug. 28, 1992

[51] Int. Cl.$^5$ .............................................. H05K 3/34
[52] U.S. Cl. ................................ 228/103; 228/180.21
[58] Field of Search ...................... 228/103, 104, 180.2, 228/225, 9

[56] References Cited

U.S. PATENT DOCUMENTS

| | | | |
|---|---|---|---|
| 3,688,582 | 9/1972 | Gradishar | 73/371 |
| 4,417,782 | 11/1983 | Clarke et al. | 350/96.29 |
| 4,459,456 | 7/1984 | Jurek et al. | 219/110 |
| 4,459,457 | 7/1984 | Jurek | 219/110 |
| 4,623,086 | 11/1986 | Tihanyi et al. | 228/123 |
| 4,657,169 | 4/1987 | Dostoomian et al. | 228/103 |
| 4,696,101 | 9/1987 | Vanzetti et al. | 228/9 |
| 4,696,104 | 9/1987 | Vanzetti et al. | 228/103 |

Primary Examiner—Samuel M. Heinrich
Attorney, Agent, or Firm—Weingarten, Schurgin, Gagnebin & Hayes

[57] ABSTRACT

A method is provided for non-contact and contact sensing of phase changes of a solder material. By adding solder to a preexisting solder joint or substrate, an infrared sensor with limited resolution capability is able to discriminate between various solder characteristics at the solder enhanced site and other thermally distracting components when the solder transitions from a solid to a liquid phase or from a liquid to a solid phase. One type of contact sensing of solder reflow is accomplished by holding a thermocouple against a solder joint. When the pre-existing solder volume is insufficient to produce the desired results, additional solder is added to the solder joint or lead. The additional solder may be solid solder, a solder pre-form, or solder paste. Contact sensing may also be achieved by placing a spring loaded probe against the solder and detecting the probe's movement as the solder softens. In another contact reflow detection technique, a thermocouple sensor is housed in a protective sleeve fillable with solder paste or molten solder. The sensor is placed against a substrate adjacent a solder joint, and is heated simultaneously with the solder joint. Detection of solder reflow in the sleeve by the thermocouple signals reflow of the adjacent solder joint.

39 Claims, 6 Drawing Sheets

SENSING OF SOLDER MELTING AND SOLIDIFICATION

FIELD OF THE INVENTION

The present invention relates to a sensing technique for detecting solder melting and solidification, and more particularly to contact and non-contact methods of determining the occurrence of a phase change in solder.

BACKGROUND OF THE INVENTION

The technique of reflow soldering electrical components or devices on a circuit board is well known. Generally, one or more electrical leads from a device are placed on top of one or more solder pads located on a circuit board. The entire circuit board, or the area immediately surrounding a particular device, is then heated until the solder comprising the interconnect between the leads and the circuit pads changes phase from solid to liquid or melts. When the solder melts the device leads and the underlying circuit pad are wetted, thereby forming a solder joint. Heating is then stopped, and the circuit board and solder joint are cooled or allowed to cool until the solder solidifies, at which point the device is fully attached. Device removal is merely a reversal of the above steps. To wit, the solder joint is heated until the solder touching the lead is heated to a temperature above its melting point, at which time the lead may be easily withdrawn from the solder, and the device removed from the circuit board. Delay or failure to detect solder reflow and subsequent temperature increases, results in excessive or unduly prolonged heating of the solder, and causes timing inefficiency, equipment damage, and poor process results.

For optimum wetting between the materials involved, the lead/pad interface and solder should be heated to a temperature above the melting point of the solder. Therefore, after reflow is sensed, the temperature must be monitored to establish that a target temperature above the melting point of the solder has been reached. In the case of eutectic or near-eutectic tin/lead solder, a temperature approximately 30° C. above the melting point is desirable. During device removal a temperature 30° C. above the solder's melting point allows the solder to reach a lower viscosity so that excess solder is not removed from the circuit pads by adhering to the leads of the device as the device is removed from the circuit during a replacement operation. In prior art methods, only solder temperature, not the phase change phenomena itself, has been monitored to determine when the correct temperature has been reached.

Generally unsuccessful attempts have been made to use remote or non-contact infrared sensors for the measurement of the temperature of an object within the sensor's field of view by detecting infrared emissions from the object. In the case of soldered electronic devices, the sensor is directed at a solder joint to detect temperature. Temperature monitoring with an infrared sensor and other methods of detecting and monitoring solder, such as detecting a change in surface reflectance as part of a soldering technique, are presented in U.S. Pat. Nos. 4,657,169 to Dostoomian et al.; 4,696,104 to Vanzetti et al.; and 4,696,101 to Vanzetti et al. These prior art methods were developed to monitor solder phase changes for relatively large solder joints found on typical J-lead chip carriers and leadless chip carriers (LCC). However, the inaccuracy and unreliability of these techniques has engendered little interest in the electronics industry.

FIG. 1 is a side view of a device 10 having a 50 mil pitch J-lead 12. For a J-lead 12 of this width, an electrical connection to a substrate 14 is made with a solder joint 16 that is 0.030 to 0.035 inches wide. FIG. 2 is an end view of FIG. 1 which further illustrates the general nature of the solder joint 16. With a J-lead 12 equipped device 10, the solder wicks up the J-lead 12 and around the perimeter of the lead 22, thereby presenting a substantial amount of solder for a sensor to view. This connection technique produces a viewing surface or solder joint 16 of approximately $4 \times 10^{-4}$ in$^2$.

FIG. 3 is a side view of a device 10 having 50 mil pitch leadless chip carrier leads 18. As with the J-lead 12, the LCC is electrically connected to the substrate 14 with a series of solder joints 16 that are typically 0.030 to 0.035 inches wide. The solder joint 16 extends vertically from the surface of the substrate 14 up the metalized castellation 18 of the device 10 and forms a relatively large bulbous type solder joint 16 when heated. FIG. 4 is an end view of FIG. 3 which further illustrates the general nature of the solder joint 16. The solder joint 16 of the LCC device 10 presents an even larger solder volume for sensor viewing than the J-lead 12, the LCC solder joint 16 presenting a surface of approximately $9 \times 10^{-4}$ in$^2$.

While an infrared sensor may function properly in wide or coarse pitch applications, fine pitch devices having a lead width in the range of 0.015 to 0.002 inches wide are more becoming important and form a necessary part of many new designs. Fine pitch devices typically present a reduced volume and reduced surface, a scant $1 \times 10^{-4}$ in$^2$ for viewing a 25 mil pitch device, and correspondingly less for a smaller lead width. As lead pitch gets finer, there is less and less distance between center lines of adjacent leads and the viewing area is correspondingly smaller. As the solder volume gets smaller, the change in rate of temperature rise, which is interpreted to detect phase change, is affected by the solder being heat sunk by adjacent masses. Eventually, the diminutive volume of solder is so masked by heat sinking that phase changes are not detectable.

Accordingly, prior art non-contact measurement systems are of little or no use with fine pitch devices due to limitations of field of view, volume (therefore mass) of solder, and state of the art sensors. Specifically, in non-contact detection of infrared energy the amount of solder in the field of view of the sensor appears quite small in relation to other items in the field of view, such as metal leads, the device package, and the circuit substrate. Therefore, the infrared emission from the solder joint is small in comparison to the other infrared emissions received by the sensor. This multiplicity of strong emissions masks the relatively weak signal from the solder joint at which the sensor is directed. Thus, the insufficiently restricted field of view of the sensor, or its inability to discriminate between objects in its field of view, results in its inability to sense anomalies in the rate of heating of solder materials.

In FIG. 5 for example, a fine pitch device 20 having "gull wing" leads 22, only has a thin coating (if any) of solder on top of each lead 22. This creates problems in sensing the anomaly of solder melting because the thin layer of solder more specifically represents the temperature of the underlying metal of the lead 22. Furthermore, the solder develops intermetallics with the base metal of the lead 22 so that the solder's melting point is no longer that of the solder originally deposited on the substrate. FIG. 6 is an end view of the solder joint 16 of FIG. 5, and FIG. 7 is a top view of the same solder joint 16, both views illustrating the nature of the solder joint 16.

The reduction in viewing surface presented to an infrared sensor in the fine pitch device 20 virtually eliminates the observability of the change in emissivity, reflectance, and shape of the solder while it melts using prior art techniques and devices. Even if the field of view is reduced to a 0.001 inch spot on the solder joint, the decreased solder volume used with fine pitch devices causes the solder temperature to be effectively masked by the surrounding thermal masses that are in intimate contact with the solder.

Ideally, a monitoring sensor used in the process would instantly detect and continue to accurately monitor the phase change event itself, and use that information to trigger subsequent events and calibrate subsequent measurements. The present invention fulfills the above need, and overcomes present sensing difficulties by enhancing the emissions from the area of the solder joint and by enhancing a sensor's ability to discriminate between thermal sources.

SUMMARY OF THE INVENTION

In surmounting the foregoing disadvantages, the present invention provides a method of sensing solder melting and solidification. Embodiments of the method are provided for both contact and non-contact sensing and monitoring of various solder characteristics which signal phase changes of a solder material. This sensing method is valuable in either component installation or removal applications.

In one embodiment of the method, adding solder to a preexisting solder joint enables an infrared sensor with limited resolution capability to discriminate between the solder signature of the augmented solder joint and other thermally distracting components when the solder transitions from a solid to a liquid phase or from a liquid to a solid phase. The supplemental solder may be a paste, solid solder, or a solder preform, and have either similar or different material properties than the preexisting solder to which it is added. The sensor may monitor a single solder characteristic or a combination of factors, such as temperature, emissivity, reflectance, texture, volume, or shape.

Another embodiment of the method involves inserting a thermocouple into a mass of supplemental solder paste placed on a lead. The embedded thermocouple instantly and accurately measures solder temperature for the detection of phase change.

Yet another embodiment of a contact method for detecting reflow uses a spring loaded probe that sinks into the solder as at softens or melts. Movement of the probe is monitored by a secondary sensor, such as a photosensor, a linear variable differential transformer, or a pressure sensor.

Still another embodiment of the method incorporates a small thermocouple junction in a protective sleeve having a cavity filled with solder paste. The sensor is placed adjacent a solder joint to be monitored and the area is heated. The solder paste is then monitored for a phase change.

DESCRIPTION OF THE DRAWINGS

The invention will be more fully understood from the following detailed description taken in conjunction with the accompanying drawings in which.

DETAILED DESCRIPTION OF THE INVENTION

Figure 1:
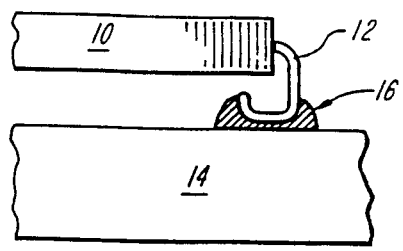
FIG. 1 is a side view of a J-lead carrier.
Figure 2:
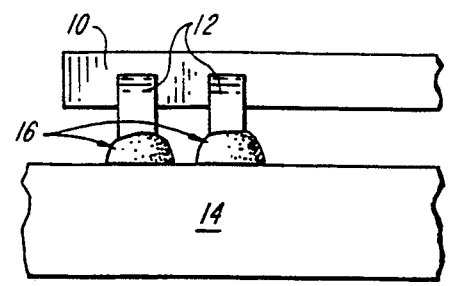
FIG. 2 is an end view of the J-lead carrier of FIG. 1.
Figure 3:
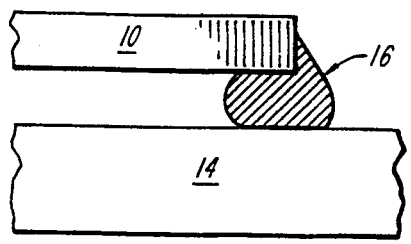
FIG. 3 is a side view of a leadless chip carrier.
Figure 4:
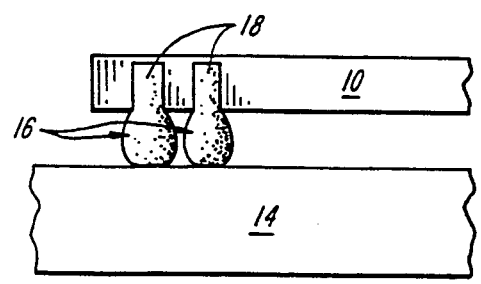
FIG. 4 is an end view of the leadless chip carrier of FIG. 3.
Figure 5:
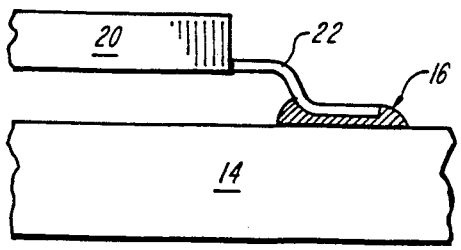
FIG. 5 is a side view of a gull wing chip carrier.
Figure 6:
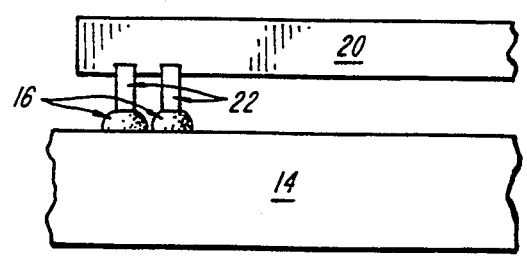
FIG. 6 is a end view of the gull wind chip carrier of FIG. 5.
Figure 7:
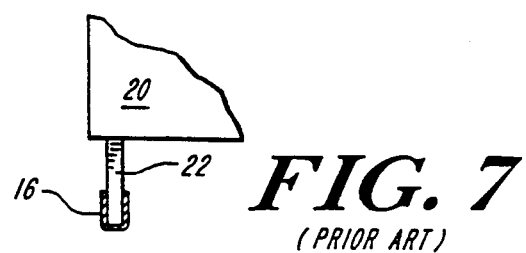
FIG. 7 is a top view of the gull wing chip carrier of FIG. 5.
Figure 8:
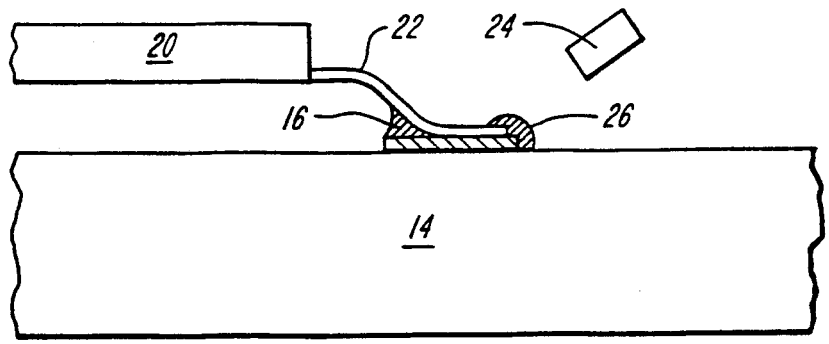
FIG. 8 is a schematic view of a detection enhancement method of the invention using solder paste and an infrared sensor.

Referring to FIG. 8, a method of enhancing an infrared sensor's ability to detect phase changes of solder in a solder joint 16 for a fine pitch device 20 is shown. An infrared sensor 24 with limited thermal discrimination capacity, such as is known to those familiar with the art, is directed toward a solder joint 16 to be monitored. While the following discussion focuses on infrared sensors 24, the teachings of the present invention are equally applicable to sensing techniques with other optical sensors.

A small amount of supplemental solder, hereinafter referred to as sensing solder 26, is selected for use based upon the solder characteristics or properties a given sensor will monitor, such as: emissivity, reflectance, temperature, texture, shape, and volume. When an infrared sensor 24 is used, the sensing solder 26 is chosen for its emissivity and reflectance characteristics. The sensing solder 26 is then placed on an easily accessed portion of a lead 22 or leads of the fine pitch device 20 within the field of view of the infrared sensor 24. The sensing solder 26 may either be in direct contact with a solder joint 16 to be monitored or simply in contact with the lead 22 which is in contact with the solder joint 16, as is shown in FIG. 8, wherein the sensing solder 26 has been applied to "toe" of a gull wing lead 22. Addition of the sensing solder 26 either creates a viewing surface where hitherto one had not existed, or enlarges an extant viewing surface by increasing the total volume of solder at the solder joint 16. In either circumstance, an increased infrared signal is emitted from the enhanced solder joint 16, thus facilitating detection of an anomaly when the point of reflow or phase change is reached.

The sensing solder 26 may be solid solder applied with a soldering iron or a similar device, or a solder preform of an exact or customized size and shape which is placed over, around, or adjacent the lead 22. Alternatively, the sensing solder 26 may be a solder paste or cream that may be precisely dispensed through a syringe and applied with a needle or other similar means such as a "doctor blade" to a single lead 22, an entire line of leads, or around the four sides of a lead or leads. Typically, the solder paste comprises solder metal in extremely small particulate form in a suspension of flux to permit extrusion though a small diameter orifice such as a syringe or needle. The ability of solder paste to increase sensor sensitivity at the point of reflow or phase change is significant because the solder paste has notably different emissivity characteristics than the original solder joint 16.

The enhancement method of adding sensing solder to or near the lead 22 is particularly suited for rework operations, as some significant amount of the added sensing solder 26 is withdrawn from the substrate 14 when the device is pulled away or removed from it. Conversely, when a replacement fine pitch device 20 is placed onto the vacated position on the substrate 14, any remaining sensing solder 26 which was not removed during the removal process augments the quantity of solder forming the solder joint 16 for the replacement fine pitch device 20.

Figure 9:
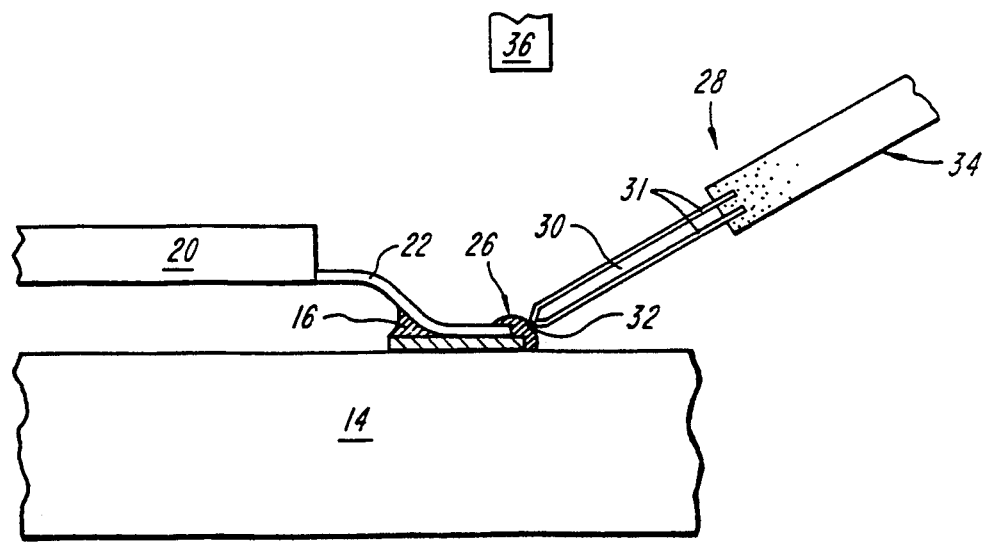
FIG. 9 is a schematic of a detection enhancement method of the invention using solder paste and a contact sensor.

Adding sensing solder 26 to a lead 22 or a solder joint 16 is effective for enhancing or facilitating contact sensing as well as non-contacting sensing. FIG. 9 illustrates a method of contact sensing using an exemplary contact sensor 28. The contact sensor 28 comprises a thermocouple 30 with an exposed thermocouple junction 32, and is mounted in a protective tube 34. The protective tube 34 provides electrical and thermal insulation for thermocouple wires 31. Sensing solder 26 is applied to the lead 22 as described with respect to FIG. 8, and the exposed thermocouple junction 32 is immersed in the sensing solder 26 which is heated by a thermal source 36.

Both the thermocouple 30 and the thermocouple junction 32 must be quite small to be completely surrounded by the sensing solder 26. Also, a very small thermocouple 30 is able to respond rapidly to changes in temperature of the sensing solder 26 and does not draw more than a nominal amount of heat away from the site being monitored, precluding an adverse impact on temperature measurement accuracy. Furthermore, the thermocouple 30 must be shielded so that it measures only the temperature of the sensing solder 26 and is not responding directly to the heat being applied from the thermal source 36, or heat withdrawn by a heat sink such as cooling air. Mineral oxide or other suitable insulators may be used for the body of the protective tube 34, its lining, or its covering.

When the heat is applied to the area surrounding the lead 22, by hot gas or infrared for example, the solder in the solder joint 16 melts at the same time the sensing solder 26 does when the thermal mass of the sensor matches the thermal mass of the solder joint 26 being measured. Free from other thermal distractions, the thermocouple 30 provides accurate and continuous monitoring of a phase change as it occurs. It is also contemplated that other temperature sensors can be used in the above described contact sensing method, such as: a resistance thermometer; a sensor which measures the resistance between two probes implanted in the solder joint 26; or a sensor which measures the change in the velocity of sound waves through the solder joint 26 as the solder liquifies. In some situations, the solder joint 26 is sufficiently large to obtain accurate contact measurements of the anomaly by pressing a thermocouple against the surface of the solder joint 26.

Figure 10:
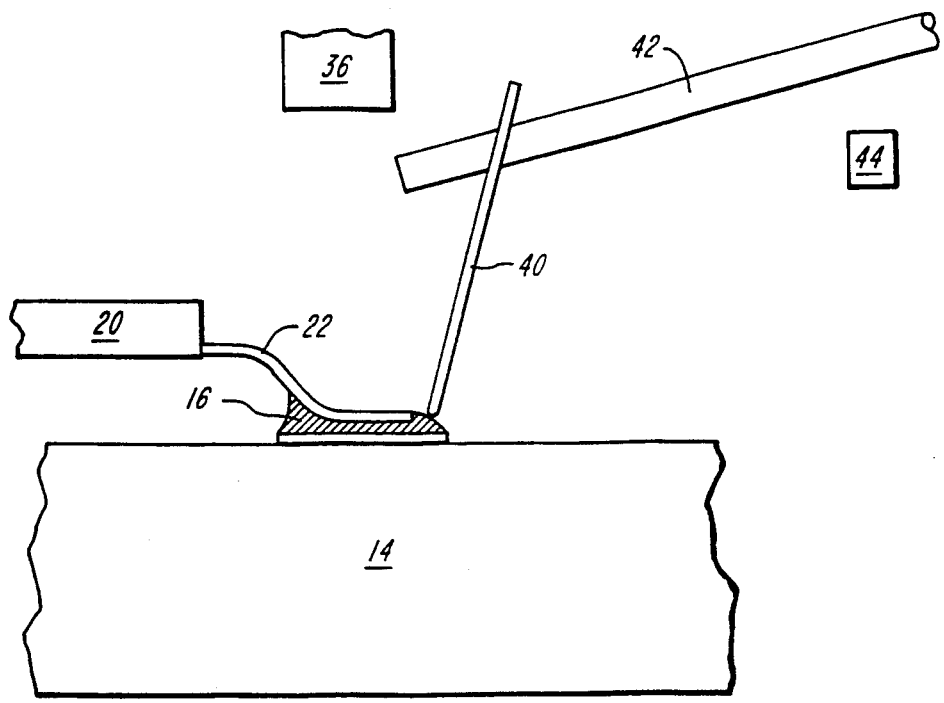
FIG. 10 is a schematic of a detection enhancement method of the invention using a spring-loaded probe.

An alternative method of contact sensing which has utility with or without the addition of sensing solder 26 is shown in FIG. 10, wherein a spring-loaded probe 38 is shown in contact with the solder joint 16. The solder joint 16 shown in FIG. 10 is sufficiently large and accessible to place a pointed tip 40 of the spring-loaded probe 38 thereon, yet too small to provide a distinguishable thermal source for a remote sensor. When the solder joint 16 is heated to its melting temperature, the probe tip 40 penetrates the melted solder an amount sufficient to cause a moment arm 42 attached to the probe tip 40 to move. The movement of the moment arm 42 is then detected by a secondary sensor 44 such as: a photoelectric sensor, a linear variable differential transformer, or a pressure sensor. Penetration of the probe tip 40 indicates the onset of solder melting, which may be useful in itself, but it may also be used to initialize a time measurement for determining solder temperature which is required for a subsequent process step.

Figure 11:
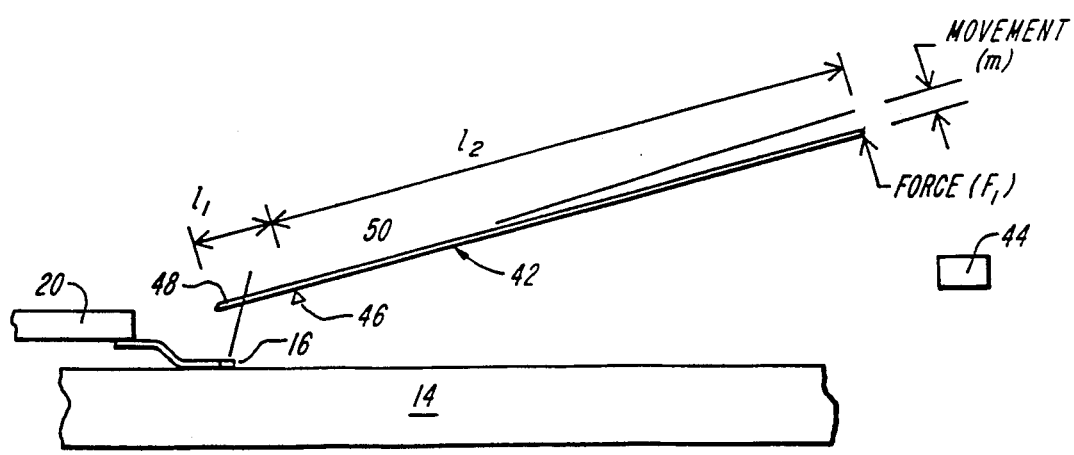
FIG. 11 is a schematic of a detection enhancement method of FIG. 10 showing additional details of spring-loaded probe.

Due to the minuscule size of a solder joint on fine pitch devices 20, movement of the probe tip 40 will obviously be slight and difficult to detect by any means. Accordingly, it is desirable to amplify the movement of the probe tip 40 to ensure that the secondary sensor 44 detects its motion. FIG. 11 depicts a method for so doing. The probe tip 40 is shown connected to the moment arm 42 which is positioned on a pivot 46 to mechanically amplify or exaggerate the movement of the probe tip 40. The moment arm 42 is thus divided into a short moment arm 48 on the probe tip side of the pivot 46, and a long moment arm 50 on the opposite side. A force F is applied to the long moment arm 50 in the direction shown which causes the probe tip 40 to be gently pressed against the solder joint 16. When the probe tip 40 moves, its motion is magnified by the ratio of length of the long moment arm 50 to the short moment arm 48 and a motion M is created.

Figure 12:
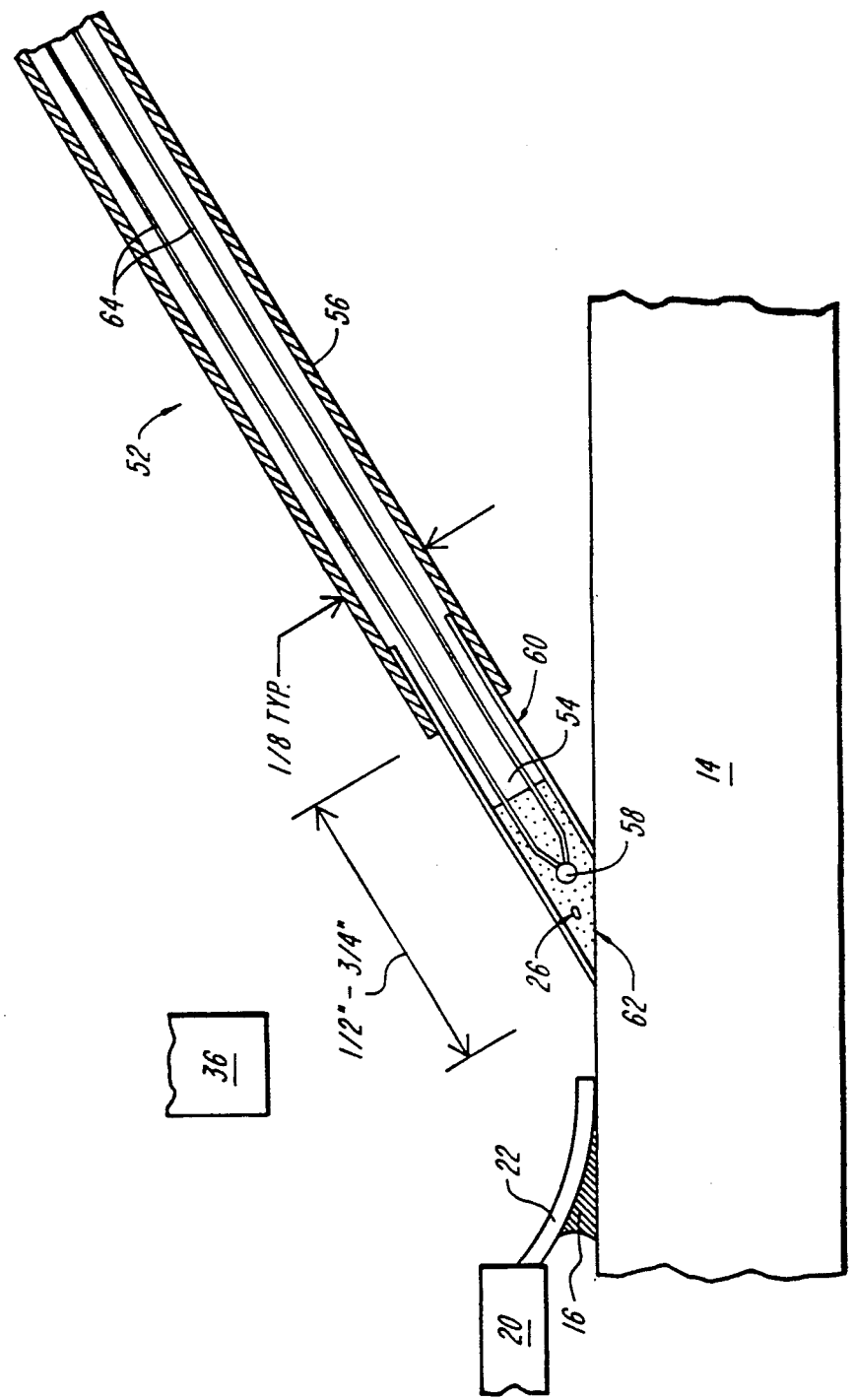
FIG. 12 is a schematic of a detection enhancement method of the invention using a shielded thermocouple and solder paste.

FIG. 12 depicts yet another embodiment of a contact sensor, a shielded thermocouple 52 that is especially useful for applications requiring determination of the temperature at which a fine pitch device 20 should be removed from a substrate 14 during rework. Unlike the contact sensors 28 and 38 of FIG. 9 and 10 respectively, which are placed directly against or into the sensing solder 26 or a solder joint 16, the shielded thermocouple 52 is placed on the substrate 14 adjacent the solder joint 16 to be monitored.

The shielded thermocouple 52 comprises a small gauge thermocouple 54 mounted in a protective tube 56 like the protective tube 34 of FIG. 9. The thermocouple junction 58 extends slightly beyond the end of the protective tube 56 and a sleeve 60 made from a material which is wet by solder, such as copper, surrounds this the thermocouple junction 58 to form an end cavity 62. In the exemplary embodiment, the protective tube 56 which houses thermocouple wires 64 may be in the range of 0.125 to 0.625 inches in diameter. The sleeve 60 is as small as possible, typically 0.500 to 0.750 inches in length and 0.050 to 0.100 inches in diameter. The open end of the sleeve 60 is cut or ground at an angle to permit complete contact of the entire open end against the substrate 14 when the shielded thermocouple 52 is held pencil like by an operator. In the exemplary embodiment, the angle is 45 to 60 degrees, however, the cut angle may vary as desired or the shielded thermocouple 52 may be bent or curved. Additionally, the shielded thermocouple 52 may be supported by a stand instead of a hand.

The diameter and wall thickness of the sleeve 60, and the volume of sensing solder 26 are selected to be thermally similar to the solder joint 16 to be measured. Next, a small amount of sensing solder 26 is inserted into the open end of the sleeve 60 by gently squirting the sensing solder 26 into the end cavity 62, or by dipping the sleeve 60 into a bulk reservoir of molten sensing solder, so that it makes contact with the thermocouple junction 58. The sleeve 60 of the shielded thermocouple 52 is then placed in contact with the substrate 14 adjacent a solder joint 16 whose temperature is to be measured.

When heat from a thermal source 36 is directed toward the sleeve 60 and the solder joint 16, the sensing solder 26 and the solder joint 16 are heated simultaneously. When the sensing solder 26 melts, the melting is detected by the thermocouple 54 and indicates that the solder of the solder joint 16 has also melted, thus signaling that the fine pitch device 20 can be removed from the substrate 14.

Figure 13:
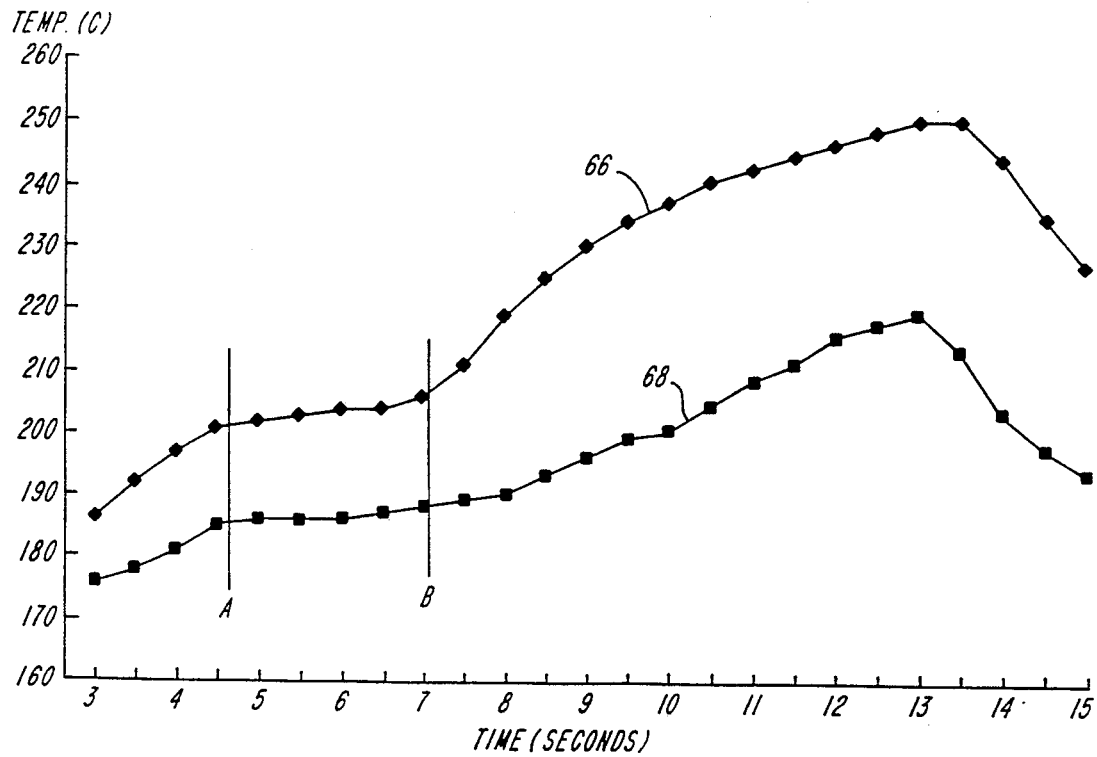
FIG. 13 is a graphic depiction of solder anomaly sensing using the shielded thermocouple of FIG. 12, and the contact sensor of FIG. 9.

The effectiveness of the various embodiments of the invention is more fully appreciated when considered with respect to the following time and temperature graphs depicting solder anomaly sensing test results. FIG. 13 is a graphic depiction of anomaly sensing of solder using the shielded thermocouple 52 of FIG. 12 and the contact sensor 28 of FIG. 9. The upper curve 66 represents the readings from the shielded thermocouple 52, and the lower curve 68 represents readings from the contact sensor 28. The flat portion of each curve from A to B indicates a phase change in the solder. Both of the sensors 28 and 52 sensed the solder anomaly, although at apparently different temperatures. Computer software can be used to interpret the information and recalibrates the temperature at which the anomaly occurs to the melting point of the solder joint 16 (182° C. for example).

Figure 14:
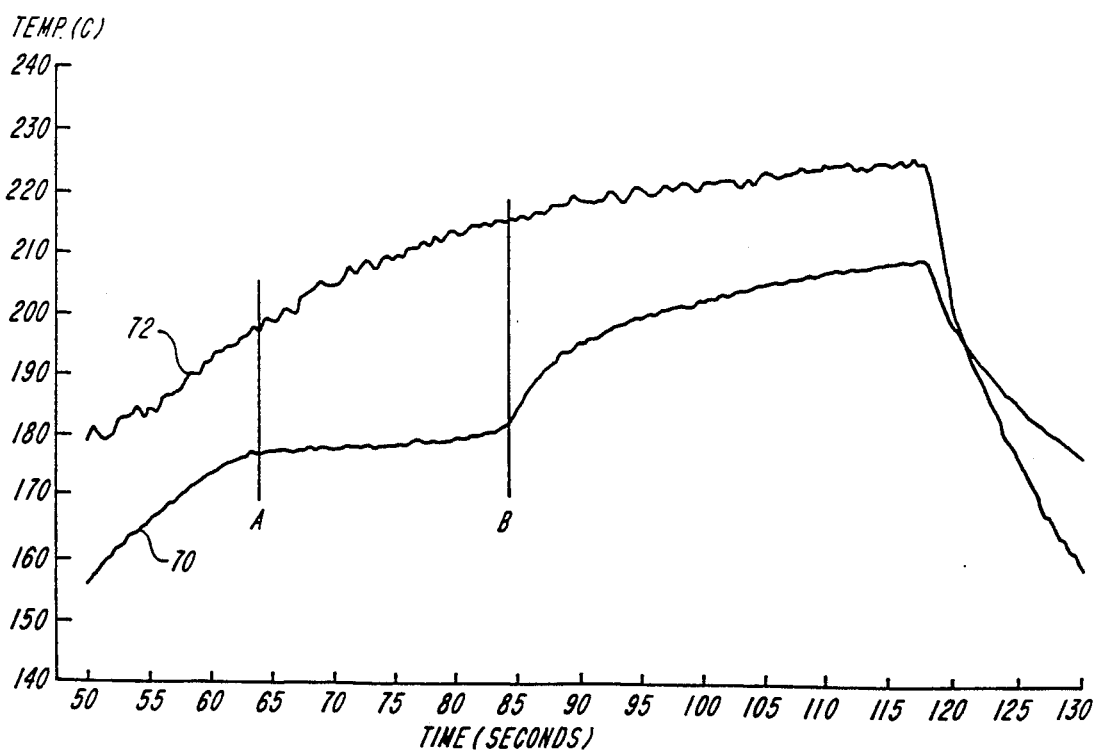
FIG. 14 is a graphic comparison of the detection capability of the contact sensor of FIG. 9 and an unassisted infrared sensor.

FIG. 14 is a graphic depiction of the contrast in solder anomaly detection capability between the contact sensor 28 of the invention and a prior art infrared sensor 24 without the addition of sensing solder 26. The infrared sensor 24 used for the test had a field of view of 0.016 inches and was directed at a solder joint having a lead 22 that was 0.016 inches wide and 0.100 inches long. The lower curve 70, representing the contact sensor 28, clearly shows the solder anomaly designated by the flat portion of the lower curve 70 from A to B. However, while the infrared sensor 24 detected the increasing temperature as indicated in the upper curve 72, it was unable to isolate the heat signature of the solder joint 16 from other thermal distractions, and was thus not sufficiently sensitive to sense the solder anomaly.

Figure 15:
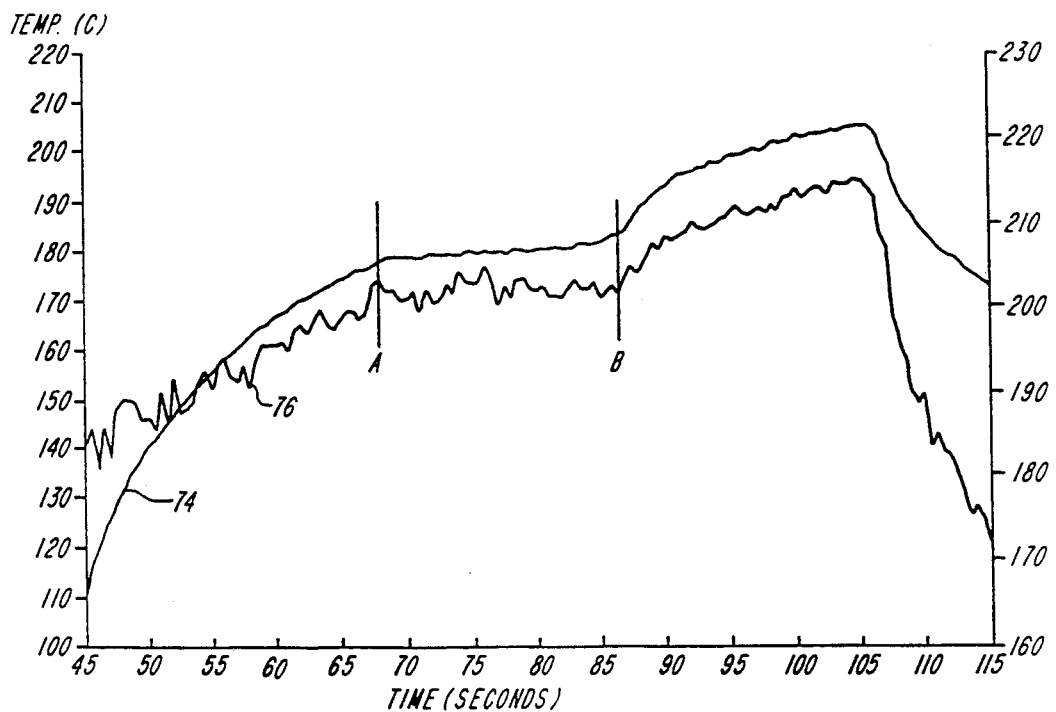
FIG. 15 is a graphic depiction of the thermal enhancement provided by supplemental solder, having characteristics similar to an existing solder joint, for detection by an infrared sensor.

FIG. 15 graphically depicts the enhancement in detection capability of an infrared sensor 24, when used in conjunction with additional sensing solder 26 having the same characteristics as the solder of a solder joint 16. The upper or relatively smooth curve 74 represents temperature measurement with the contact sensor 28 according to the method of the invention, and the lower or irregular curve 76 depicts the measurements of the infrared sensor 24 which was aimed at the additional sensing solder 26. Although the infrared sensor curve 76 exhibited significant noise characteristics, the anomaly from A to B was still recognizable. Appropriate filtering and/or software can compensate for the noise.

Figure 16:
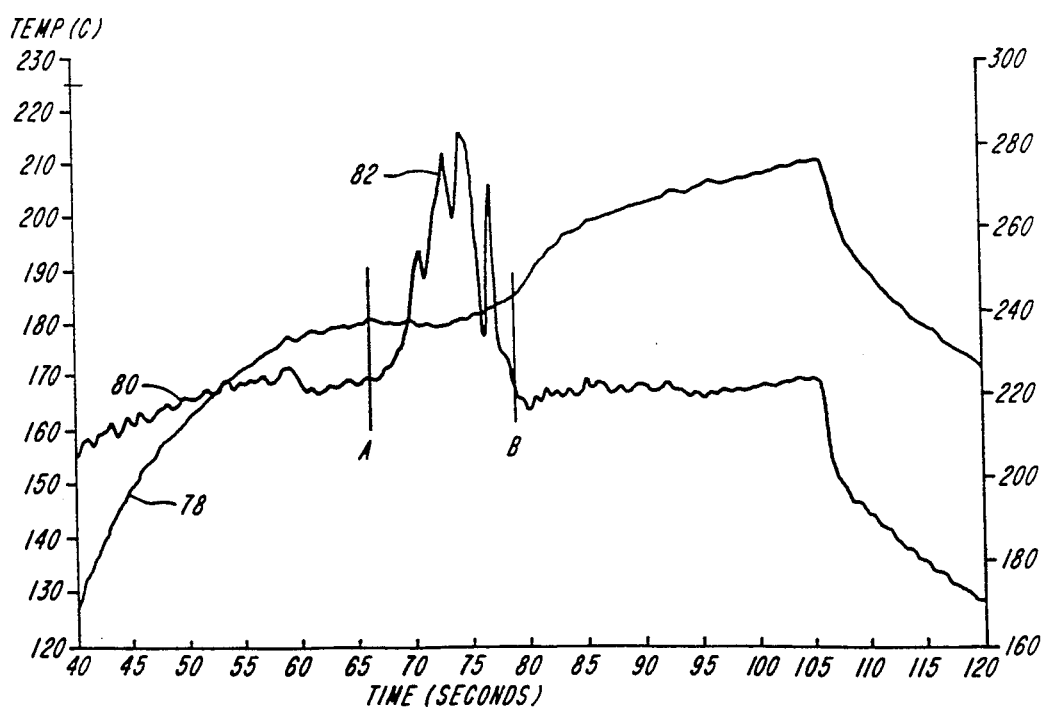
FIG. 16 is a graphic depiction of the thermal enhancement provided by supplemental solder in the form of solder paste, having characteristics different than an existing solder joint, for detection by an infrared sensor.

FIG. 16 illustrates the remarkable improvement in detection capability of an infrared sensor 24 when used with solder paste as the sensing solder 26, as taught with respect to the embodiment of the invention illustrated in FIG. 9. Again, the smooth curve 78 depicts the measurements of the contact sensor 28 of the invention, and the lower curve 80 depicts the measurements of the infrared sensor 24. The infrared signal as shown of the lower curve 80, however, was different than a straight temperature measurement. The temperature first appeared to drop, then rise rapidly and significantly, then fell off again after solder reflow. This "spike" 82 from A to B was the result of the infrared sensor 24 having detected the change in emissivity and shape of the solder paste which occurred during the melting period of about five seconds. Even though the spike 82 was not a true temperature measurement, it still signaled that reflow had occurred.

These and other examples of the concept of the invention illustrated above are intended by way of example and the actual scope of the invention is to be determined solely from the following claims.

We claim:

1. A method of sensing phase changes of a solder joint comprising the steps of:
    placing a small amount of a sensing solder on said solder joint;
    providing a thermal source to alter the temperature of said sensing solder and said solder joint to effect a phase change in said sensing solder and said solder joint; and
    monitoring a characteristic of said sensing solder to detect said phase change.

2. The method of claim 1, wherein said thermal source is a heat source and said phase change is from a solid phase to at least a liquid phase.

3. The method of claim 1, wherein said detection of said phase change is used to calibrate a subsequent temperature measurement.

4. The method of claim 3, wherein said subsequent temperature is an optimum wetting temperature for said solder joint and a device lead.

5. The method of claim 3, wherein said subsequent temperature is a temperature at which the viscosity of said solder joint is lower than the viscosity of said solder joint at its melting point.

6. The method of claim 1, wherein said detection of said phase change is used to trigger a subsequent step.

7. The method of claim 6, wherein said subsequent step comprises evaluating said characteristic being monitored to determine the temperature of said solder joint.

8. The method of claim 7, further comprising the step of removing a device having at least one electrical lead bonded to a substrate with said solder joint, from said substrate, when said evaluating step indicates that said solder joint is at a target temperature above the melting point of said solder joint.

9. The method of claim 7, further comprising the step of placing at least one electrical lead of a device on a substrate when said characteristic being monitored indicates that said solder joint is at a target temperature above the melting point of said solder joint.

10. The method of claim 1, wherein said thermal source is a heat sink and said phase change is from a liquid phase to a solid phase.

11. The method of claim 1, wherein said sensing solder is a solder preform for covering an electrical lead.

12. The method of claim 1, wherein said sensing solder is solid solder.

13. The method of claim 1, wherein said sensing solder is a solder paste.

14. The method of claim 13, wherein said solder paste comprises solder metal in extremely small particulate form in a suspension of flux to permit application of said solder paste with a hypodermic syringe.

15. The method of claim 14, wherein said solder paste has different emissivity characteristics than said solder joint.

16. The method of claim 15, wherein said different emissivity characteristics of said solder paste enhance a detection capability of said sensor when said solder metal changes phase.

17. The method of claim 1, wherein said characteristic to be monitored comprises solder emissivity.

18. The method of claim 1, wherein said characteristic to be monitored comprises solder reflectance.

19. The method of claim 1, wherein said characteristic to be monitored includes solder volume.

20. The method of claim 1, wherein said characteristic to be monitored includes solder shape.

21. The method of claim 1, wherein said characteristic to be monitored includes solder surface texture.

22. The method of claim 1, wherein said characteristic to be monitored includes change in measured temperature.

23. The method of claim 1, wherein said monitoring is performed by non-contact means.

24. The method of claim 17, wherein said non-contact means comprises infrared sensing.

25. The method of claim 1, wherein said monitoring is performed by a contact sensor.

26. A method of sensing phase changes of a solder joint comprising the steps of:
heating said solder joint to a temperature above its melting temperature to effect a phase change in said solder joint from a solid phase to at least a liquid phase; and
contact monitoring of a characteristic of said solder joint with a contact sensor to detect said phase change.

27. The method of claim 26, wherein said contact monitoring comprises placing said contact sensor on said solder joint prior to said heating step.

28. The method of claim 26, wherein said contact monitoring comprises placing said contact sensor on said solder joint during said heating step.

29. The method of claim 26, wherein said contact monitoring comprises placing said contact sensor in said solder joint after said heating step.

30. The method of claim 26, wherein said contact sensor comprises a thermocouple.

31. The method of claim 26, wherein said contact sensor comprises:
a spring loaded probe having a movable element; and
a secondary sensor capable of detecting movement of said movable element;
wherein said movable element is in contact with said solder surface and;
wherein melting of said solder surface causes said movable element to penetrate said solder surface, creating a movement of said movable element that may be detected by said secondary sensor.

32. The method of claim 31, wherein said secondary sensor comprises a photoelectric sensor.

33. The method of claim 31, wherein said secondary sensor comprises a linear variable differential transformer.

34. The method of claim 31, wherein said secondary sensor comprises a pressure sensor.

35. A method of sensing phase changes of a solder joint using a thermocouple, comprising the steps of:
selecting a sensing solder that has characteristics similar to said solder joint to be evaluated;
placing said sensing solder into a sensor, said sensor comprising:
a small gauge thermocouple;
a protective tube for housing said thermocouple and for providing thermal and electrical insulation for said thermocouple, said thermocouple extending from said tube to expose a thermocouple junction; and
a sleeve surrounding said thermocouple junction, said sleeve having an open end into which said sensing solder may be introduced and placed in contact with said thermocouple junction;
placing said sensor in contact with a surface adjacent said solder joint;
heating said solder joint and said sensor to a temperature to effect a phase change in said sensing solder from a solid phase to a liquid phase; and
monitoring a characteristic of said sensing solder to detect said phase change.

36. The method of claim 35, wherein said sleeve comprises a material that is wet by solder.

37. The method of claim 36, wherein said material is copper.

38. The method of claim 35, wherein said sensing solder is solder paste.

39. The method of claim 35, wherein said sensing solder is molten solder.

* * * * *